United States Patent [19]

Fukasawa

[11] Patent Number: 5,512,155

[45] Date of Patent: Apr. 30, 1996

[54] FILM FORMING APPARATUS

[75] Inventor: Yoshiharu Fukasawa, Yokohama, Japan

[73] Assignee: Kabushiki Kaisha Toshiba, Kawasaki, Japan

[21] Appl. No.: 366,380

[22] Filed: Dec. 29, 1994

Related U.S. Application Data

[63] Continuation of Ser. No. 107,132, Aug. 16, 1993, abandoned, which is a continuation of Ser. No. 863,388, Apr. 3, 1992, abandoned, which is a continuation of Ser. No. 531,390, Jun. 1, 1990, abandoned.

[30] Foreign Application Priority Data

Jun. 2, 1989 [JP] Japan .................................. 1-139136

[51] Int. Cl.$^6$ ............................ C23C 14/34; C23C 16/00
[52] U.S. Cl. ............................ 204/298.11; 204/298.12; 204/298.15; 118/723 VE; 118/723 E
[58] Field of Search .................. 204/192.12, 192.15, 204/298.11, 298.12, 298.13, 298.15; 118/723 VE, 723 E, 724, 726

[56] References Cited

U.S. PATENT DOCUMENTS

| | | | |
|---|---|---|---|
| 4,392,931 | 7/1983 | Maniv et al. | 204/298.28 X |
| 4,416,759 | 11/1983 | Harra et al. | 204/298.11 |
| 4,468,313 | 8/1984 | Okumura et al. | 204/298.13 X |
| 4,485,000 | 11/1984 | Kawaguchi et al. | 204/192.15 X |
| 4,508,612 | 4/1985 | Blackwell et al. | 204/298.11 |
| 4,814,056 | 3/1989 | Welty | 204/298.11 |

FOREIGN PATENT DOCUMENTS 63-83257  4/1988  Japan .

OTHER PUBLICATIONS

*Patent Abstracts of Japan*, vol. 12, No. 312, 24 Aug. 1988; & JP-A-63 83 257, 13, Apr. 1988.
*Patent Abstracts of Japan*, vol. 13, No. 39, 27 Jan. 1989; & JP-A-63 238, Apr. 10, 1988.
Vossen et al., "Thin Film Processes", Academic Press, N.Y., p. 41, 1978.

*Primary Examiner*—Nam Nguyen
*Attorney, Agent, or Firm*—Foley & Lardner

[57] ABSTRACT

A film forming apparatus such as a sputtering apparatus, a vacuum evaporation apparatus, or a CVD apparatus, having a film forming substrate and a film forming source both arranged within a film forming chamber, for forming a thin film on the film forming substrate. This film forming apparatus has within the film forming chamber a apparatus part other than the film forming substrate on which a component of the film forming source, e.g., a target, is deposited. At least on the surface of the apparatus part on which the component of the film forming source is deposited is composed of a material whose thermal expansion coefficient is equal or close to that of the thin film to be formed. Even if the component of the film forming source forms a deposition on the apparatus part other than the film forming substrate, the separation of such a deposition due to a thermal stress can be controlled because the thermal expansion coefficients of the deposition and apparatus part are equal or close to each other. Accordingly, it is possible to prevent the infiltration of the separated deposition into the formed film as fine particles.

9 Claims, 1 Drawing Sheet

FILM FORMING APPARATUS

This application is a continuation of application Ser. No. 08/107,132, filed Aug. 16, 1993, abandoned, which is a continuation of prior application Ser. No. 07/863,388, abandoned, filed on Apr. 3, 1992, abandoned, which is a continuation of prior application Ser. No. 07/531,390, filed on Jun. 1, 1990 abandoned.

FIELD OF THE INVENTION AND RELATED ART STATEMENT

This invention relates to a film forming apparatus such as a sputtering apparatus, a vacuum evaporation apparatus, and a chemical vapor deposition (CVD) apparatus used in forming a thin film on the surfaces of various substrates and boards, and a film forming method.

In fabricating electric and electronic parts of various kinds, complicated wiring patterns using an electroconductive metal material are formed on the surface of a substrate according to their application. First, a thin film composed of an electroconductive metal such as Mo, W, Ti, $MoSi_2$, $WSi_2$, $TiSi_2$ or their compounds is formed by, e.g., a sputtering method on the surface of a film forming substrate such as a semiconductor substrate or a glass substrate. Thereafter, the electroconductive thin film is subjected to a predetermined etching process parts other than desired wiring circuits are removed therefrom to leave a wiring network thereon.

The sputtering method involves both irradiation of a predetermined ion species to a target made of the same material as a thin film to be formed on the surface of a substrate, to thereby bombard the target material, and adhesion of the bombarded particles to the surface of the film forming substrate to thereby form a thin film.

There has been a growing demand, in recent years, for higher density wiring patterns, met by narrowing the wiring width or by like means as the degree of integration of semiconductor elements continues increasing. For example, in fabricating large-scale integrated circuits (LSI) and very large-scale integrated circuits (VLSI), wiring widths are on the decrease at a rapid pace as indicated by a 1 MDRAM (one megabit dynamic random-access memory) whose wiring width is about 1 μm and a 4 MDRAM whose wiring width is about 0.8 μm.

As wiring patterns are made finer and finer, those made of a thin film formed by the sputtering method present higher susceptibility to the problems of defective wiring and the like. One of the notable problems is, e.g., the deposition of impurities from an earth shield.

The problem that impurities from an earth shield are deposited by sputtering is taken care of by forming the earth shield with the same material as the target (see Japanese Patent Unexamined Publication No. 83257/1988), or the like, but they have not been good enough.

The inventors of the present invention found that, in forming a fine wiring pattern following the above-described wiring rule, the cause of wiring defects is more relative to the mixture of fine particles exfoliated from the interior surface of the sputtering apparatus into the thin film than to the mixture of impurities into the thin film by sputtering from a source other than the target, e.g. the earth shield. A mixture of fine particles of even about 0.3 μm in diameter into a thin film which is being formed by the sputtering method would result in causing defective conduction if the wiring width of the fine wiring pattern to be formed is, e.g., 1 μm or 0.8 μm.

However, the reality is that the measures taken by the current sputtering apparatus to prevent the mixture of fine particles of about 0.3 μm in diameter are not satisfactory nor has any clear cause of the existence of floating particles been verified. Further, the mixture of fine particles is not only on thin films formed by the sputtering method but also on those obtained by a vacuum evaporation method, a CVD method, or the like.

To such a reality, there is a strong demand for a film forming apparatus such as a sputtering apparatus, a vacuum evaporation apparatus, a CVD apparatus, or the like capable of sufficiently preventing the mixture of fine particles of about 0.3 μm in diameter and substantially reducing the occurrence of wiring defects.

OBJECTS AND SUMMARY OF THE INVENTION

It is therefore an object of the present invention to provide a film forming apparatus such as a sputtering apparatus, a vacuum evaporation apparatus, a CVD apparatus, or the like which is capable of controlling the mixture of fine particles into a thin film being formed as impurities and which is less likely to cause defective wiring and like defects.

Another object of the present invention is to provide a film forming method which is capable of controlling the mixture of fine particles into a thin film being formed as impurities and which is less likely to cause defective wiring and like defects thereby to allow thin films to be deposited repetitively.

A film forming apparatus according to the present invention comprises a film forming substrate and a film forming source both arranged within a film forming chamber and forms a thin film on the film forming substrate. This film forming apparatus also comprises an apparatus part on which a component of the film forming source arranged within the film forming chamber is deposited. At least the surface of the apparatus part is composed substantially of a material having a thermal expansion coefficient equal or close to that of the thin film to be formed.

Further, the film forming method according to the present invention comprises the step of forming a thin film composed of a component of a film forming source on a film forming substrate arranged within a film forming chamber. In this method, a material having a thermal expansion coefficient equal or close to that of the thin film to be formed is arranged at least on the surface of the apparatus part on which the component of the film forming source arranged within the film forming chamber is deposited, and under this condition a thin film is formed by a sputtering method, vacuum evaporation method, or a CVD method.

The film forming apparatus according to the present invention is specifically a apparatus such as a sputtering apparatus, a vacuum evaporation apparatus, a CVD apparatus, or the like for depositing thin films. The film forming source in the film forming apparatus of the present invention means a target in the sputtering method or a deposition source in deposition methods.

For example, the sputtering apparatus according to the present invention includes a film forming substrate and a target arranged within a vacuum vessel so as to face each other, and forms a thin film on the film forming substrate by sputtering the target. This sputtering apparatus comprises a apparatus part on which a component of the target arranged within the vacuum vessel is deposited, and at least the surface of this apparatus part is composed substantially of a material having a thermal expansion coefficient equal or close to that of the thin film to be formed or of the component of the target itself.

In the film forming apparatus of the present invention, the apparatus part other than the film forming substrate on which a component of a film forming source, e.g., a component of the target, is likely to be deposited contains at least a material listed below as a component constituting the surface thereof.

(1) A metal or its compound having a thermal expansion coefficient equal or close to that of a thin film to be formed on the film forming substrate.

(2) A metal or its compound constituting a film forming source, e.g., a sputtering target.

A preferable metal or its compound having a thermal expansion coefficient equal or close to that of a film to be formed as described in item (1) may be such that the difference in thermal expansion coefficient between it and the film to be formed is within the range of $\pm 7.5 \times 10^{-6}$. A more preferable range of difference is $\pm 6 \times 10^{-6}$ and a still more preferable range of difference is $\pm 4 \times 10^{-6}$.

In a conventional film forming apparatus such as a conventional sputtering apparatus, the apparatus part on which the component of the target is deposited has mainly been formed of a stainless steel (e.g., SUS304) or the like from considerations of strength and cost of the material. If a thin film made of Mo, W, Ti, and compounds such as their silicides, is to be formed on such a apparatus part, the component for forming these thin films is deposited on the apparatus part made of the stainless steel or the like excluding the film forming substrate, no matter how small the amount of deposition may be. Such a deposition will develop cracks due to the difference in the thermal expansion coefficient of the component of the target with respect to the stainless steel or the like (the thermal expansion coefficient of the deposition is only several tenths of that of the stainless steel) as the film forming apparatus is heated. As a result, the film deposited on the surface of the stainless steel or the like is separated from the surface of the stainless steel in the form of fine particles and is redeposited on the surface of the film forming substrate together with the regular film forming component that is splashing.

For example, in the case where a silicide film of such a metal as Mo, W, Ti, or the like is to be formed by a reactive sputtering method, a target having a metal and Si separately arranged is used. The distance for the sputtered particles to be splashed is different depending on their destination, whether to the film forming substrate or to other parts, and what is deposited on the apparatus part other than the film forming substrate is thus a silicon-rich compound. Generally, this silicon-rich compound has a high electric resistance. A deposition of this kind is separated from the deposit and formed into particles as above, and when it is mixed into the thin film on the film forming substrate, it causes wiring defects. It is because the presence of any high resistance portion on a wiring pattern in a ratio of about 30% with respect to its wiring width allows an overcurrent to flow through the remaining electroconductive portion, thereby causing wiring breakage, short circuits, and the like due to presence of abnormal current and heating on the remaining electroconductive portion. Further, a target component of pure metal would induce short circuits through its contact with the other substrate in a multilayer substrate structure. That is, in the case where the apparatus part on which the target component is likely to be deposited is made of a stainless steel or the like as in the prior art, a thin film is always in danger of being mixed with the above-described fine particles, although in small amounts, and thus being broken or shorted.

Although it is very unlikely that a component of the above apparatus part is sputtered therefrom and deposited on the surface of the film forming apparatus, it cannot be denied that it happens. Thus, it is likely that such a component will be mixed with the thin film and deteriorate film characteristics.

In contrast thereto, in a film forming apparatus according to the present invention, an apparatus part other than a film forming substrate, on which a component of a film forming source is deposited, is composed of a material having a thermal expansion coefficient equal or close to that of a thin film to be formed or the component of the film forming source itself, at least on the surface thereof. Therefore, even if the film forming apparatus is heated, the separation of a deposition from the surface of the apparatus part due to thermal stress can be controlled. This opens the way to allowing direct control over the production of the fine particles that are mixed into the thin film as impurities. Further, a material composed of a component of the film forming source is used at least on the surface of the apparatus part other than the film forming substrate on which the component of the film forming source is deposited. Should the component of the apparatus part be sputtered and deposited on the film forming substrate, such a sputtered and deposited component does not act as an impurity, because it is the same material as the target component. Thus, it is very unlikely that such a component will be mixed into the formed thin film to impair the film characteristics, and hence it is a more desirable construction.

The film forming apparatus and method according to the present invention has therefore been made in view of the fact that the cause of the mixture of impurities such as fine particles sputtered onto a thin film to be formed on the surface of a film forming substrate such as a semiconductor substrate or a glass substrate is, as described previously, the use of a stainless steel or the like whose thermal expansion coefficient is greatly different from that of the thin film formed mainly on the apparatus part on which the component of the film forming source arranged within the vacuum vessel is likely to be deposited.

The term "an apparatus part on which a component of a film forming source is deposited" as used herein is not limited to all of the parts on which the component of the film forming source is deposited; but includes the case where the term is applied only to a portion of the apparatus parts, if there are a plurality of such apparatus parts. In such a case, it is apparent that the advantages of the present invention can be obtained, although not equal in the degree of their possible effect.

A case where a material whose thermal expansion coefficient is close to that of a film to be formed is used in the present invention will be described by taking a sputtering apparatus as an example.

An illustrative material whose thermal expansion coefficient is close to that of a film to be formed includes electroconductive metals among components of a target. For example, if a film to be formed is Mo Six (the thermal expansion coefficient $\alpha$ of MoSi$_2$ is $3\times10^{-6}$/°C.), the electroconductive metal among the components of the target is molybdenum (the thermal expansion coefficient $\alpha$ of Mo is $5.1\times10^{-6}$/°C.) and it is Mo that constitutes the whole of the apparatus parts including a target fixing jig, a film forming substrate fixing jig, and a deposition shielding board on which the component of the target is likely to be deposited. Or, a material whose core is formed of a different material (e.g., a conventional stainless steel such as SUS304 whose thermal expansion coefficient α is 17×10$^6$/°C.) and the surface of the core is coated to a predetermined thickness with molybdenum may be used. Further, a cushion such as titanium, whose thermal expansion coefficient is intermediate may be interposed between the core material made of the stainless steel or the like and the molybdenum film.

Further, a material which is to be used as that for forming the apparatus part and whose thermal expansion coefficient is close to a film to be formed is not limited to metals or their compounds constituting the target material as described above. If, for example, W Six is used as a target, the use of molybdenum on the part on which a component of the target is deposited may not present any problem. This is because the thermal expansion coefficients of tungsten and molybdenum are close to each other. Still, in this case, there will be no problem if the core material of the part on which the component of the target is deposited is made of a different material (e.g., SUS304) and the surface of the core material is coated with a molybdenum to a predetermined thickness.

As described in the foregoing pages, in the present invention, any metal or its compound whose thermal expansion coefficient is close to that of a film to be formed can be used. Therefore, if a thin film to be formed is, e.g., Mo Six, it goes without saying that metals such as titanium, tantalum, vanadium, niobium, hafnium and their compounds, and low expansive alloys and the like will provide the advantages similar to those obtained by the present invention.

The advantages similar to the above can be obtained in other apparatus such as a vacuum evaporation apparatus or a CVD apparatus when the materials illustrated in the sputtering apparatus are used to constitute the whole of the apparatus parts on which a component of a target is likely to be deposited.

The film forming apparatus according to the present invention such as a sputtering apparatus has its feature in the material of which the apparatus is made. Thus, its shape, mounting positions, and the like are similar to the conventional apparatus.

DETAILED DESCRIPTION OF THE PREFERRED EMBODIMENT

An embodiment in which a film forming apparatus of the present invention is applied to a sputtering apparatus will now be described with reference to the accompanying drawings.

Figure 1:
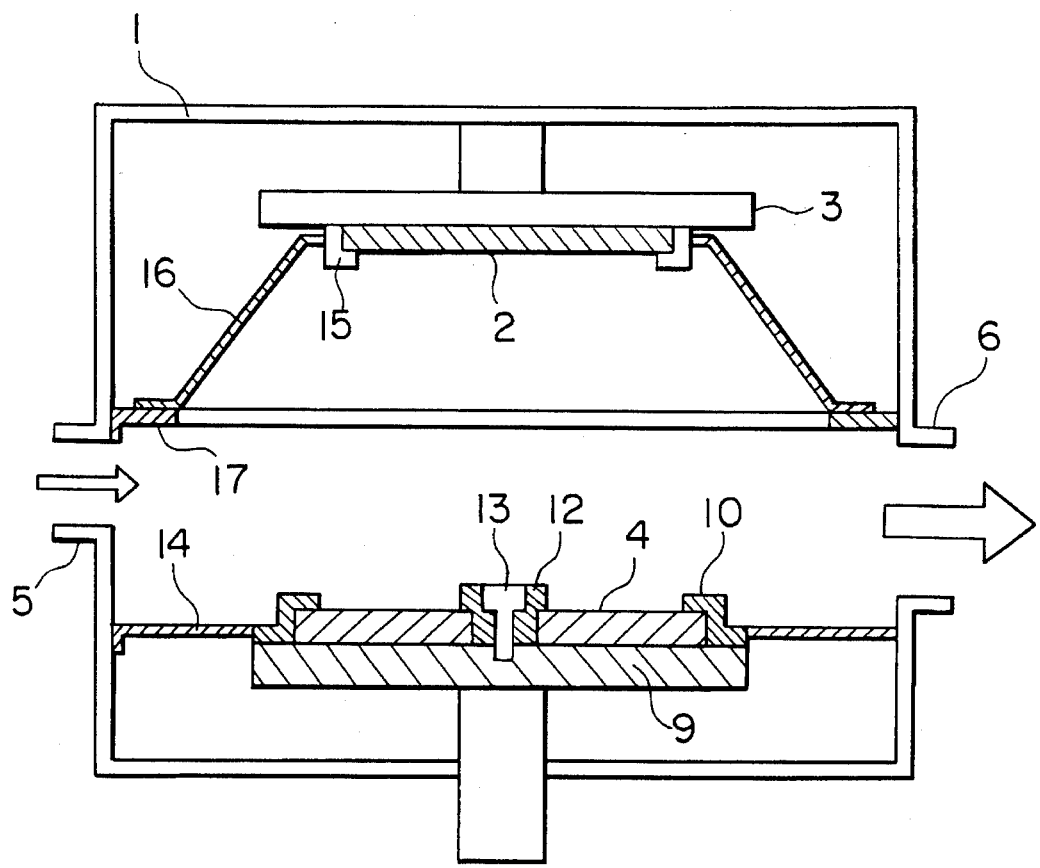
FIG. 1 is a schematic showing a sputtering apparatus which is an embodiment of the present invention.
Figure 2:
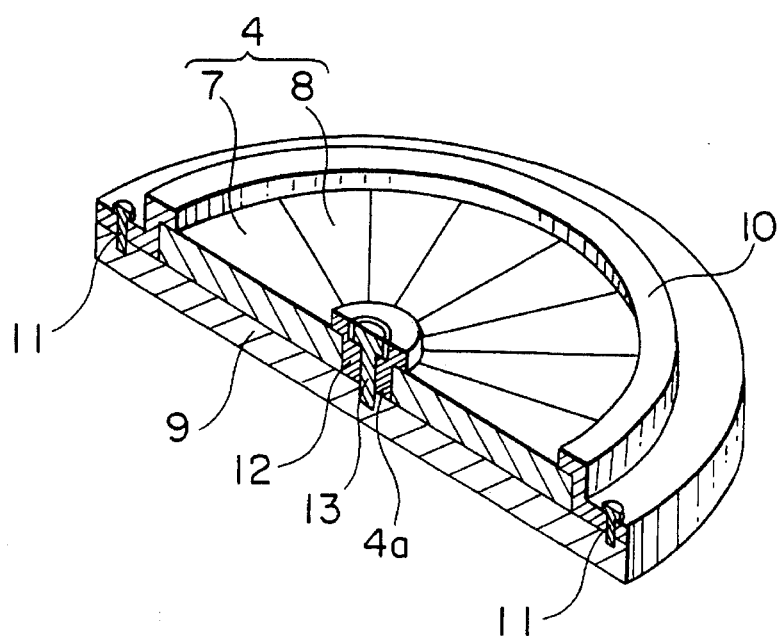
FIG. 2 is an enlarged schematic showing the vicinity of the jig for fixing a sputtering target of the sputtering apparatus shown in FIG. 1.

FIG. 1 is a schematic showing the construction of a sputtering apparatus which is an embodiment of the present invention. In a vacuum vessel 1, a substrate holder 3 for holding a film forming substrate 2 and a target 4 are arranged so as to be opposed at a predetermined interval. A gas supply system 5 for guiding a sputtering gas and an evacuation system 6 for evacuating the vacuum vessel 1 to a predetermined vacuum level are connected to the vacuum vessel 1.

The target 4 is of composite type made up of a combination of a fanlike block body 7 selected from the group of high purity molybdenum Mo (coefficient of linear expansion α=5.1×10$^{-6}$/°C.), titanium Ti (coefficient of linear expansion α=8.9×10$^{-6}$/°C.), tungsten W (coefficient of linear expansion α=4.5×10$^{-6}$/°C.), tantalum Ta (coefficient of linear expansion α=6.5×10$^{-6}$/°C.), vanadium V (coefficient of linear expansion α=8.3×10$^{-6}$/°C.), niobium Nb (coefficient of linear expansion α=7.2×10$^{-6}$/°C.), hafnium Hf (coefficient of linear expansion α=6.0×10$^{-6}$/°C.) and a fanlike block body 8 composed of high purity silicon Si (a purity of 99.999% or greater). The target 4 is disc-shaped.

This composite type target 4 is arranged on a backing plate 9 formed of a high purity oxygen free copper. The composite type target 4 is mounted on the backing plate 9 not only by fixing a periphery fixing jig 10 arranged at the periphery of the target on the backing plate 9 using a tap bolt 11 but also by fixing a center flange 12 for fixing the center, inserted into a center mounting hole 4a, on the backing plate 9 using a tap bolt 13.

The periphery fixing jig 10, the center flange 12, and the tap bolts 11 and 13 are made of at least one of the above group of seven high purity materials, respectively. Actually, the material used for fabricating the center flange 12 for fixing the center was higher in purity than the material used for fabricating the periphery fixing jig 10. The difference between the material of the periphery fixing jig 10 and that of the center flange 12 is because there is a possibility that the center is more heavily sputtered than the periphery and because exfoliation of the formed film by the heat cycle may happen more easily in center than in the periphery. Therefore, a material of the center whose purity is higher than that of the periphery was used. The use of a material whose purity is equal to or higher than the center than for the periphery presents no problem, but that is costly.

Around the target 4 is a flat first deposition preventing board 14 so as to prevent the deposition of a sputtered target material on the inner walls of the vacuum vessel 1. The first deposition preventing board 14 is also made of one of the above group of seven high purity materials.

On the other hand, the substrate holder 3 arranged at a position facing the target 4 at the predetermined interval has the film forming substrate 2. This film forming substrate 2 is fixed on the substrate holder 3 by a substrate fixing jig disposed at the periphery of the film forming substrate 2. This substrate fixing jig 15 is made of one of the above group of seven high purity materials in the manner similar to the periphery fixing jig 10 and the center flange 12. The film forming substrate 2 may include a semiconductor substrate and a glass substrate.

Around the film forming substrate 2 is a truncated conical second deposition preventing board 16. This second deposition preventing board 16 is fixed on a partition board 17 arranged approximately on the middle level of the vacuum vessel 1. The second deposition preventing board 16 and the partition board 17 serve to prevent the sputtered target from being deposited on the inner walls of the vacuum vessel 1. The second deposition preventing board 16 and the partition board 17 are likewise made of one of the above group of seven high purity materials, respectively.

If an earth shield is provided around the target 4, it is preferable that the earth shield 4 should be made of one of the above group of seven high purity materials in the manner similar to the periphery fixing jig 10 and the center flange 12.

In the sputtering apparatus thus constructed, the part on which a component of the target is deposited includes the periphery fixing jig 10 for fixing the target 4, the center flange 12, the tap bolts 11 and 13, the substrate fixing jig 15 for fixing the substrate 2, and the first and second deposition preventing boards 14 and 16, and the like, all of which are made of one of the above group of seven high purity materials whose thermal expansion coefficient, as described above, is equal or close to that of the target, respectively.

Thin films were deposited using the sputtering apparatus thus constructed and targets, each composed of one of the above seven metals. The result of measurements made on the amount of mixture of fine particles into each of the films thus formed on the film forming substrate will be shown in Table 1 by material. It can be said for the object of the present invention that the smaller the amount of mixture of fine particles which cause defects on the film forming substrate, the better. In the table, the mark, ⊙ means optimal, O good, Δ usable, ▲ not usable.

Then, measurements were made on the amount of fine particles of 0.3 μm or greater in diameter in the form of the number of impurities that were mixed into a thin film being formed on the surface of a film forming substrate with a silicide as a target. The results will be shown in Table 2 by material. Table 2 shows the material of which each apparatus part on which a component of the target is deposited is formed. The apparatus part on which two or more kinds of material are indicated is made up of a core material and a coating material that coats the core material.

For purposes of comparison with the present invention, the result of measurement in the case where the part on which the target component is deposited is made of a stainless steel or the like as in the prior art will be shown as well.

TABLE 2

| Target | Periphery fixing jig | Center flange | Tap bolt | Substrate fixing jig | 1st depos. prevent board | 2nd depos. prevent board | Number of particles mixed (/100 cm²) |
|---|---|---|---|---|---|---|---|
| MoSi₂ | Mo $5.1 \times 10^{-6}$ | Mo $5.1 \times 10^{-6}$ | Mo $5.1 \times 10^{-6}$ | Mo $5.1 \times 10^{-6}$ | Mo $5.1 \times 10^{-6}$ | Mo $5.1 \times 10^{-6}$ | 80 |
| MoSi₂ | Mo $5.1 \times 10^{-6}$ | Mo $5.1 \times 10^{-6}$ | Mo $5.1 \times 10^{-6}$ | Mo $5.1 \times 10^{-6}$ | Ti $8.9 \times 10^{-6}$ | Ti $8.9 \times 10^{-6}$ | 95 |
| MoSi₂ | Mo coating on SUS304 $11 \times 10^{-5}$ | Mo $5.1 \times 10^{-6}$ | Mo $5.1 \times 10^{-6}$ | Ti $8.9 \times 10^{-6}$ | Ti $8.9 \times 10^{-6}$ | Ti $8.9 \times 10^{-6}$ | 119 |
| WSi₂ | W coating on Mo $4.9 \times 10^{-6}$ | W $4.5 \times 10^{-6}$ | W $4.5 \times 10^{-6}$ | Mo $5.1 \times 10^{-6}$ | Mo $5.1 \times 10^{-6}$ | Mo $5.1 \times 10^{-6}$ | 75 |
| WSi₂ | W coating on SUS304 $10 \times 10^{-6}$ | W $4.5 \times 10^{-6}$ | Mo $5.1 \times 10^{-6}$ | Ti $8.9 \times 10^{-6}$ | Ti $8.9 \times 10^{-6}$ | Ti $8.9 \times 10^{-6}$ | 111 |
| TiSi₂ | Ti $8.9 \times 10^{-6}$ | Ti $8.9 \times 10^{-6}$ | Ti $8.9 \times 10^{-6}$ | Ti $8.9 \times 10^{-6}$ | Ti $8.9 \times 10^{-6}$ | Ti $8.9 \times 10^{-6}$ | 83 |
| TiSi₂ | Mo coating on SUS304 $11 \times 10^{-6}$ | Ti $8.9 \times 10^{-6}$ | Ti $8.9 \times 10^{-6}$ | Mo coating on SUS304 $11 \times 10^{-6}$ | Ti $8.9 \times 10^{-6}$ | Ti $8.9 \times 10^{-6}$ | 119 |
| MoSi₂ | SUS304 $17 \times 10^{-6}$ | SUS304 $17 \times 10^{-6}$ | SUS304 $17 \times 10^{-6}$ | SUS304 $17 \times 10^{-6}$ | SUS304 $17 \times 10^{-6}$ | SUS304 $17 \times 10^{-6}$ | 148 |
| MoSi₂ | MoSi₂ coating on SUS304 $10 \times 10^{-6}$ | Mo $5.1 \times 10^{-6}$ | Mo $5.1 \times 10^{-6}$ | SUS304 $17 \times 10^{-6}$ | SUS304 $17 \times 10^{-6}$ | SUS304 $17 \times 10^{-6}$ | 142 |

TABLE 1

Target fixing jig
Film forming substrate fixing jig
Components such as anti-deposition board

| | Mo | Ti | W | Ta | V | Nb | Hf |
|---|---|---|---|---|---|---|---|
| Target | | | | | | | |
| Mo | ⊙ | Δ | ⊙ | O | Δ | O | ⊙ |
| Ti | Δ | ⊙ | Δ | O | ⊙ | O | Δ |
| W | ⊙ | Δ | ⊙ | O | Δ | Δ | O |
| Ta | O | O | O | ⊙ | O | ⊙ | ⊙ |
| V | Δ | ⊙ | Δ | O | ⊙ | O | O |
| Nb | O | O | Δ | ⊙ | O | ⊙ | O |
| Hf | ⊙ | Δ | O | ⊙ | O | O | ⊙ |

As is apparent from Table 1, the non-preferable combination of a target and a apparatus part on which a component of the target is deposited is only that of titanium and tungsten, and that any combinations of the same metals are all optimal.

The values in lower case in the table is the thermal expansion coefficient of each material.

As is apparent from Table 2, a more remarkable reduction in the number of fine particles of 0.3 μm or greater in diameter is exhibited by the case where the surface of the apparatus part on which the target component is deposited is made of a material which has a thermal expansion coefficient which is close to that of the target as in the present invention, rather than the case where SUS304 is present as in the prior art.

Furthermore, in the case where at least the surface of the apparatus part on which the target component is deposited is made of a material composed of the target component itself, even if a component of the apparatus part on which the target component is deposited is sputtered from the apparatus part to form a deposition on the film forming substrate, such deposition does not deteriorate the film characteristics by infiltrating into a formed film, because it is of the same component as the target and, therefore, not an impurity in the formed film.

What is claimed is:

1. A film forming apparatus comprising:
   a) means for forming a metal silicide thin film containing a transition metal selected from the group consisting of Mo, Ti, W, Ta, V, Nb and Hf, said forming means including:
1) a film forming chamber;
2) a film forming substrate arranged within said film forming chamber;
3) a film forming source, arranged within said film forming chamber, comprising a Si component and at least one transition metal component selected from the group consisting of Mo, Ti, W, Ta, V, Nb and Hf; and
4) support/shield structures arranged within said chamber for supporting said substrate and said source and for shielding said substrate; and b) means for preventing emission from said support/shield structures of metal silicide particles deposited on said support/shield structures during operation of said film forming apparatus, said preventing means including the surface of said support/shield structures coated with at least one metal selected from the group consisting of Mo, Ti, W, Ta, V, Nb and Hf, such that the difference in the thermal expansion coefficient between said metal silicide thin film and said support/shield structures is within the range of $\pm 7.5 \times 10^{-6}/°C$.

2. A film forming apparatus as claimed in claim 1, said film forming apparatus comprises a sputtering apparatus, a vacuum evaporation apparatus, or a CVD (chemical vapor deposition) apparatus.

3. A film forming apparatus as claimed in claim 1, wherein said film forming source includes a block composed of at least one component selected from the metals Mo, Ti, W, Ta, V, Nb and Hf, and another block composed of Si.

4. A sputtering apparatus comprising:
a) means for forming a metal silicide thin film containing a transition metal selected from the group consisting of Mo, Ti, W, Ta, V, Nb and Hf, said forming means including:
1) a vacuum vessel;
2) a film forming substrate arranged within said vacuum vessel;
3) a target arranged within said vacuum vessel to face said film forming substrate, said target comprising a Si component and at least one transition metal component selected from the group consisting of Mo, Ti, W, Ta, V, Nb and Hf; and
4) support/shield structures arranged within said vacuum vessel for supporting said substrate and target and for shielding said substrate; and b) means for preventing emission from said support/shield structures of metal silicide particles deposited on said support/shield structures during operation of said sputtering apparatus, said preventing means including the surface of said support/shield structures coated with at least one metal selected from the group consisting of Mo, Ti, W, Ta, V, Nb and Hf, such that the difference in the thermal expansion coefficient between said metal silicide thin film and said support/shield structures is within the range of $\pm 7.5 \times 10^{-6}/°C$.

5. A film forming apparatus as claimed in claim 4, wherein the target has a block composed of at least one component selected from the transition metals Mo, Ti, W, Ta, V, Nb and Hf, and another block is a compound of Si.

6. A sputtering apparatus comprising:
1) means for forming a metal silicide thin film, including:
1) a vacuum vessel;
2) a film forming substrate held by a substrate holder within said vacuum vessel;
3) a target arranged within said vacuum vessel to face said film forming substrate, said target being placed on a backing plate, said target comprising a Si component and at least one transition metal component selected from the group consisting of Mo, Ti, W, Ta, V, Nb and Hf; and
4) a deposition preventing board for preventing the deposition of sputtered material from said target on the inner walls of said vacuum vessel; and b) means for preventing emission from said deposition preventing board of metal silicide particles deposited on said deposition preventing board during operation of said sputtering apparatus, said preventing means including the surface of said deposition preventing board coated with at least one metal selected from the group consisting of Mo, Ti, W, Ta, V, Nb and Hf, such that the difference in the thermal expansion coefficient between said metal silicide thin film and said deposition preventing board is within the range of $\pm 7.5 \times 10^{-6}/°C$.

7. A sputtering apparatus as claimed in claim 6, further comprising:
a periphery fixing jig and a center flange for fixing said target on said backing plate;
wherein at least the surface of said periphery fixing jig and said center flange of said deposition preventing board contain at least one metal selected from Mo, Ti, W, Ta, V, Nb, and Hf, and their alloys.

8. A sputtering apparatus as claimed in claim 7, further comprising:
a substrate fixing jig for fixing the film forming substrate on the substrate holder;
wherein at least the surface of the substrate fixing jig is composed of at least one metal selected from Mo, Ti, W, Ta, V, Nb and Hf, and their alloys.

9. A sputtering apparatus as claimed in claim 66, wherein the target has a block composed of at least one transition metal selected from Mo, Ti, W, Ta, V, Nb and Hf, and another, separate block composed of Si.

* * * * *

UNITED STATES PATENT AND TRADEMARK OFFICE
CERTIFICATE OF CORRECTION

PATENT NO. : 5,512,155
DATED : April 30, 1996
INVENTOR(S) : Yoshiharu FUKASAWA

It is certified that error appears in the above-indentified patent and that said Letters Patent is hereby corrected as shown below:

Column 3, line 67, after "like" insert --,-- (comma).

Column 7, Table 1, line 55, delete second occur. of "▲" and insert and insert --▲--; line 56, delete "▲" first occur. and insert --▲--.

Column 9, claim 2, line 24, after "1," insert --wherein--.

Column 10, claim 6, line 32, delete "±7.5x10⁻" and insert --±7.5x10⁻⁶--; line 33, delete "6/°C" and insert --/°C--.

Column 10, claim 7, line 41, delete "," (second occurrence).

Column 10, claim 9, line 49, delete "66" and insert --6--.

Signed and Sealed this

Eighteenth Day of March, 1997

BRUCE LEHMAN

*Attest:*

*Attesting Officer*   Commissioner of Patents and Trademarks